United States Patent [19]

Shimokawa et al.

[11] Patent Number: 4,755,768
[45] Date of Patent: Jul. 5, 1988

[54] AMPLIFIER AND DISPLAY USING THE FORMER

[75] Inventors: Ryushi Shimokawa; Seiichi Ueda, both of Takasaki; Yasuji Kamata, Hitachi; Kenkichi Yamashita, Katsuta; Kazuo Kato, Toukaimura; Hideo Sato, Hitachi, all of Japan

[73] Assignee: Hitachi, Ltd., Tokyo, Japan

[21] Appl. No.: 847,721

[22] Filed: Apr. 3, 1986

[30] Foreign Application Priority Data

Apr. 3, 1985 [JP] Japan .................. 60-68928
Apr. 3, 1985 [JP] Japan .................. 60-68929
Apr. 3, 1985 [JP] Japan .................. 60-68930

[51] Int. Cl.[4] .................. H03F 1/30; H03F 17/00
[52] U.S. Cl. .................. 330/290; 330/59
[58] Field of Search .................. 330/59, 297, 311, 288, 330/207 P, 202, 290; 358/184, 172

[56] References Cited

U.S. PATENT DOCUMENTS 4,502,020 2/1965 Nelson .................. 330/265

Primary Examiner—Gene Wan
Attorney, Agent, or Firm—Antonelli, Terry & Wands

[57] ABSTRACT

Herein disclosed are an amplifier and a display which uses the former. The amplifier includes a current amplifying circuit for sending out an amplified output current varying according to an input signal, and a current-voltage converting circuit for converting the output current of the current amplifying circuit into a voltage thereby to generate a high output voltage in response to the input signal. The supply voltage $V_{cc1}$ of the current amplifying means and the supply voltage $V_{cc2}$ of the current-voltage converting means are set separately of each other to have a relationship of $V_{cc1} < V_{cc2}$. Thus, a high output voltage can be obtained from the current-voltage converting circuit without the need for the current amplifying means to have high breakdown voltage elements.

27 Claims, 6 Drawing Sheets

AMPLIFIER AND DISPLAY USING THE FORMER

BACKGROUND OF THE INVENTION

The present invention relates to an amplifier and a display using the former. More particularly, the present invention relates to a amplifier having a high cut-off frequency (i.e., capable of processing a wide-band signal) and a high amplification factor, and an extremely fine display using the amplifier.

It is difficult to produce an amplifier which has a high cut-off frequency and a high output. Considering an integrated amplifier, the high cut-off frequency implies that the respective transistors composing the amplifier have a high value of $F_T$ (i.e., the product of gain and bandwidth). For this product, the sizes of the respective transistors to be formed in a semiconductor substrate have to be made fine. Since these fine elements naturally have low breakdown voltages, a high output cannot be generated as in a power amplifier even if the operating supply voltage ($V_{cc}$) of the IC is raised.

Conversely, if a high output is to be generated, the sizes of the respective transistors have to be enlarged, which increases the parasitic capacities of the respective transistors in a way which adversely affects the frequency characteristics.

Thus, the rise of the cut-off frequency and the improvement of the amplification factor of the amplifier are intrinsically contradictory to each other, thereby limiting their compatibility.

In developing a highly fine display, we have recognized that a demand is present for an amplifier which has a remarkably wide operating frequency band of 200 MHz and a remarkably wide output dynamic range of 0 to 200 V. It has been found impossible in the prior art because of the aforementioned reasons to provide a remarkably small integrated amplifier which has such a wide band and a high output.

SUMMARY OF THE INVENTION

A representative example of the present invention will be summarized, as follows:

An amplifier according to the present invention is constructed to comprise: voltage-current converting means for generating a current output in response to an input voltage signal; current amplifying means for amplifying the output current of the voltage-current converting means; and current-voltage converting means for converting the output current of the current amplifying means into a voltage.

The current amplifying means is integrated into a semiconductor circuit by making use of the fine process technique so that it has remarkably excellent frequency characteristics and a supply voltage $V_{cc1}$ of about 5 V.

The current amplifying means is devised, as follows, so as to effect a large currrent amplification irrespective of that low supply voltage. Specifically, a plurality of current amplifying circuits are provided for multiplying the current $I_{IN}$, which is sent out from the aforementioned voltage-current converting means, by n (where n is a positive integer), and the output currents of those plural current amplifying circuits are composed so that a large current may be resultantly generated.

More specifically, one current amplifying circuit is made of a current mirror circuit having a current mirror ratio (i.e., the ratio of the current $I_{IN}$ flowing through a reference transistor to the output current) of 1:n, and an m number of those current mirror circuits are connected in parallel so that a large output current of $n \times m \times I_{IN}$ is resultantly generated from the commonly connected output terminals of the current mirror circuits.

The current mirror ratio n of the current mirror circuits is set at such a proper value of n=32 as to retain the current mirror pairing accuracy sufficiently but not to deteriorate the RF frequencies of the current mirrors.

Next, the output current generated from that current amplifying means is converted into a voltage by making use of the current-voltage converting means (e.g., impedance means). This current-voltage converting means is provided separately from the aforementioned integrated current amplifying means and has its supply voltage $V_{cc2}$ set at a high level such as 200 V.

Thanks to the construction described above, the following effects can be attained.

1. The portions for substantially amplifying the input signal are integrated by making use of the fine process technique so that the elements composing the amplifying circuit are extremely small, and parasitic capacitance on the respective elements can be minimized to provide a high-speed operation and excellent RF characteristics.

2. The current amplifying means adopted does not amplify the input signal of fine amplitude directly into a high voltage but (i) first converts the input signal (or voltage) into current to generate the current $I_{IN}$ corresponding to the input signal, (ii) subsequently multiplies the current $I_{IN}$ by n to generate a current of $nI_{IN}$, and (iii) subsequently composes a plurality (e.g., an m number) of currents of $nI_{IN}$ to generate an output composite current of $m \times n \times I_{IN}$.

Even if the amplification factor of the fine transistor is small, a large current can be obtained by preparing a plurality of fine transistors to sum up the individual output currents of the transistors thereby to generate a moderate current and by further summing up the moderate currents to generate a large current. Thus, a high current output can be generated without the need for elements having high breakdown voltages. The construction described above can be achieved without any substantial difficulty if aluminum wiring is prepared which is made sufficiently wide to allow the large composite output current generated in the IC to flow therethrough.

3. The aforementioned output current is converted into a voltage by making use of the current-voltage converting means, which is provided separately of the integrated current amplifying means, so that a high voltage amplification can be resultantly achieved.

If a color display is constructed by using an amplifier having a wide range and a high output as a color signal amplifier, moreover, it is possible to provide an ultrafine display of remarkably high performance, which is enabled thanks to the excellent RF characteristics of that amplifier to scan an electron beam at an ultrahigh speed to reproduce a very fine image and thanks to the wide output dynamic range to adjust the electron beam outputs of individual color signals (e.g. R, G and B) over a remarkably wide range thereby to reproduce a delicate difference in the colors and in the brightnesses in a picture tube.

DESCRIPTION OF THE PREFERRED EMBODIMENTS

Embodiment 1

The first embodiment of the present invention will be described with reference to FIGS. 1 and 2.

(a) Overall Construction

Figure 1:
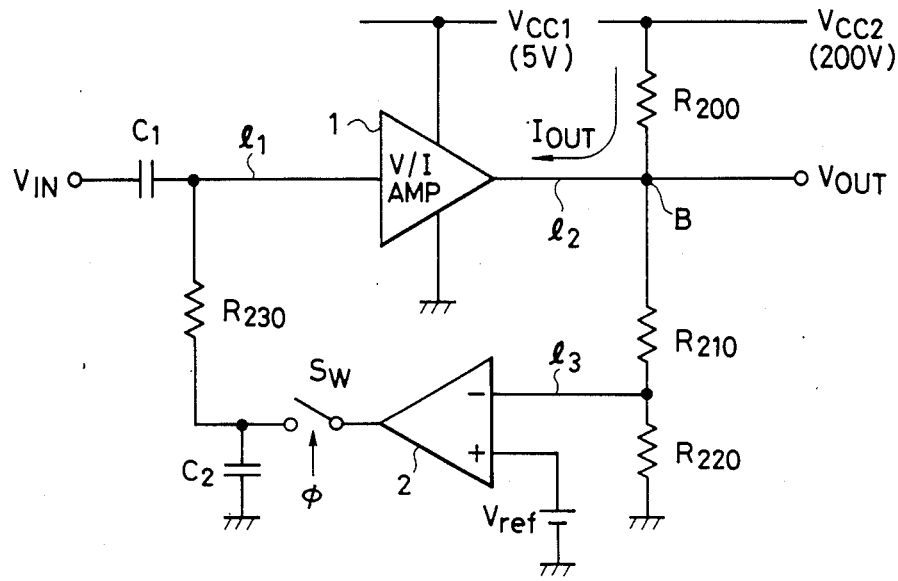
FIG. 1 is a circuit diagram showing a first embodiment of the present invention.

As shown in FIG. 1, the amplifier according to the present embodiment is constructed of a voltage-current conversion type current amplifier 1, and an impedance element $R_{200}$ for converting the output current of the current amplifier into a voltage to generate a voltage output $V_{OUT}$. In order to hold the DC (bias) voltage level of an output terminal B at a predetermined potential $V_{ref}$, moreover, there is provided a negative feedback circuit which uses an operation amplifier 2.

A resistor $R_{210}$ appearing in FIG. 1 has a high resistance (e.g., 20 K$\Omega$) and a large impedance, as viewed from the node B, and the potential of the node B is substantially equal to that of a line $l_3$ (i.e., $V_{ref}$).

This negative feedback loop is made when a switch SW controlled by a clock $\phi$ is closed, and the DC bias is held by a holding capacitor $C_2$ while the switch SW is open. A resistor $R_{230}$ also has its resistance set at a large value of 20 K$\Omega$.

The current amplifier 1 is constructed into an integrated circuit and has its supply voltage $V_{cc1}$ set at 5 V, for example, as shown in FIG. 1, whereas a supply voltage $V_{cc2}$ to be connected with the voltage-current converting resistor $R_{200}$ is set at 200 V, for example.

(b) Features

The current amplifier 1 is constructed into an integrated circuit by making use of an ultrafine process technique in accordance with principles known in the art, and preferably uses only NPN transistors as its active elements PNP transistors having bad frequency characeristics are not used.

As a result, the current amplifier 1 can operate at high speed and can have excellent frequency characteristics and a band of 200 MHz or more. In order to generate a high output despite the low supply voltage $V_{cc1}$, there is adopted a method of resultantly generating a high current of $n \times m \times I_{IN}$ by first converting an input signal into a current $I_{IN}$, by subsequently making a current $nI_{IN}$ through multiplication of the current $I_{IN}$ by n, and by subsequently composing an m number of that current $nI_{IN}$ into a composite current. In other words, by gradually amplifying the current and by summing up the amplified currents, a high output current can be obtained without any use of elements of high breakdown voltage (e.g., elements of large size).

In the present embodiment, it is set that n=32 and m=8 so that the high output current is 256 times as high as the current $I_{IN}$. As will be described hereinafter, that output current can be generated in accurate correspondence to the input signal $V_{IN}$. By finally subjecting the high output current to voltage conversion by making use of the resistor $R_{200}$, moreover, an amplified high output voltage can be resultantly generated. Thus, the amplifier under consideration has a remarkably high voltage amplification factor and a wide output dynamic range.

(c) Specified Construction of the Current Amplifier

Figure 2:
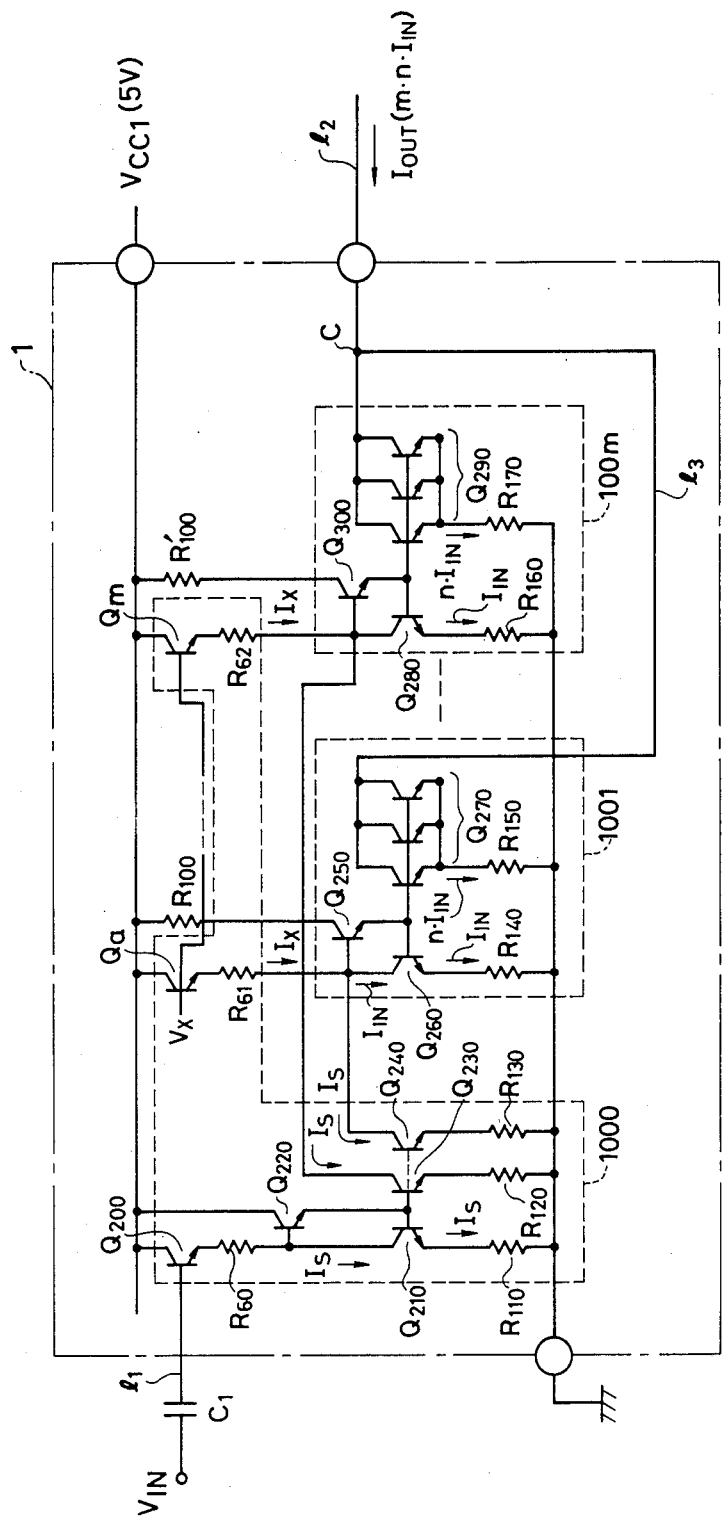
FIG. 2 is a specific circuit diagram showing the current amplifying circuit shown in FIG. 1.

FIG. 2 shows a specific circuit constructon of the current amplifier 1. A portion 1000 encircled by broken lines in FIG. 2 indicates a voltage-current converting circuit, whereas portions 1001 to 100m encircled likewise by broken lines indicate current mirror circuits acting as current amplifying circuits for multiplying the current $I_{IN}$ by n.

The output terminals of the m (e.g., m=8) number of those current mirror circuits 1001 to 100m are wired at a point C, where the currents are composed, so that a high output current $I_{OUT}$ (=m$\times$n$\times I_{IN}$) is attained at an output line $l_2$.

The circuit operations will be more specifically described in the following.

The input signal $V_{IN}$ is input on a line $l_1$ through a coupling capacitor $C_1$ to the base of a transistor $Q_{200}$ so that a current $I_S$ corresponding to the input voltage is attained from the emitter of the transistor $Q_{200}$. With reference to the current $I_S$, a plurality of currents $I_S$ are prepared by the use of the current mirror and are subtracted from a current $I_X$ so that a current $I_{IN}$ (=$I_X - I_S$) varying according to the input signal $V_{IN}$ is attained to be input to each of the current mirror circuits. Transistors $Q_{230}$-$Q_{240}$ are respectively provided to give an $I_S$ current flow to each current mirror circuit. Thus, the number of the transistors $Q_{230}$-$Q_{240}$ is the same as the number of current mirror circuits (i.e., "m") so that in the present embodiment there will be m=8 transistors $Q_{230}$-$Q_{240}$.

This current $I_{IN}$ is multiplied by n (=32) by making use of the current mirrors 1001 (to 100m), and the outputs of these individual curent mirrors 1001 to 100m are composed to generate the current $I_{OUT}$ (=m$\times$n$\times I_{IN}$). For example, although the invention is not limited to this, in order to obtain the multiplication by n=32, 32 output transistors $Q_{270}$ ($Q_{290}$) can be provided for each current mirror circuit. Only three of these 32 output transistors $Q_{270}$ ($Q_{290}$) are shown in FIG. 2 for drawing convenience for each of the current mirror circuits. Since there are m current mirror circuits, there will be a total of 256 output transistors using this arrangement.

In order to generate an output accurately according to the input $V_{IN}$ and to improve the RF characteristics, moreover, the following devices are made.

As is apparent from FIG. 2, more specifically, a plurality of the current mirror circuits 1001 to 100m are provided, each of which is composed of several output transistors $Q_{270}$ for each reference transistor, as discussed above.

If the intention was only to generate a large current, it would be sufficient to prepare one current mirror, to equip the current mirror circuit with a large number of output transistors for each reference transistor and to compose the outputs of the individual output transistors.

If such an arrangement is used, however, the parasitic capacity which is established between the bases and collectors of the output transistors of the current mirror circuits becomes so high that it markedly deteriorates the RF characteristics. A similar result will occur if too large a number of output transistors is used in each of plural current mirror circuits.

Figure 7:
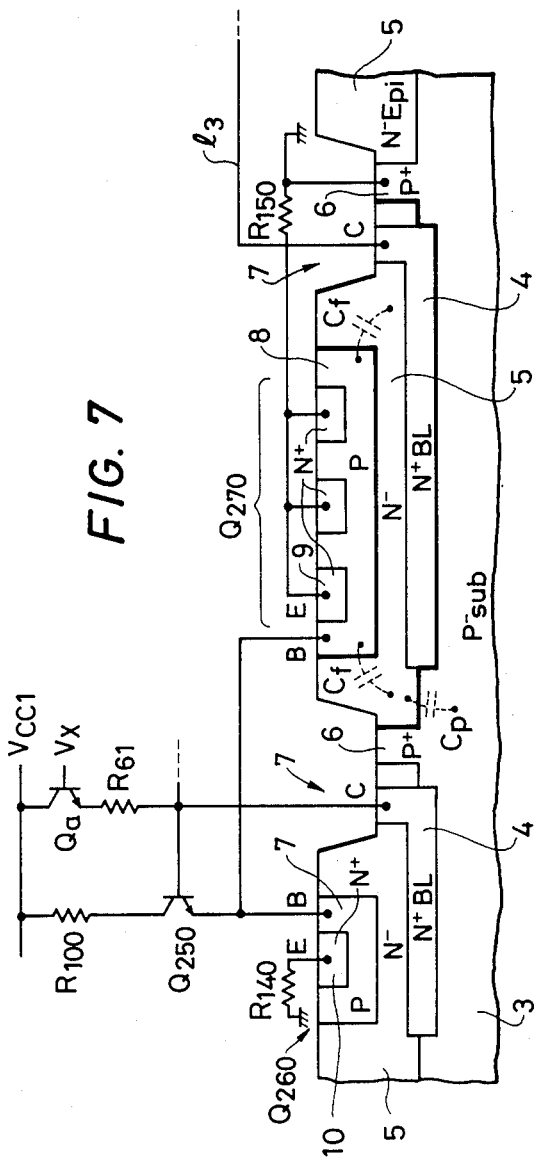
FIG. 7 is a sectional view showing the device of the integrated current mirror circuit 1001 shown in FIG. 2 (or the current mirror circuit $A_1$ shown in FIG. 5)

This is clarified by considering the device construction of an IC. FIG. 7 is a sectional view showing the IC device of the current mirror circuit 1001 (or 1002 to 100m) shown in FIG. 2. The construction of the current mirror circuit 1001 will first be briefly described.

A $P^-$-type substrate 3 is overlaid by an $N^-$-type epitaxial layer 5, and an $N^+$-type buried layer 4 is formed partially between the substrate 3 and the epitaxial layer 5.

This $N^-$-type epitaxial layer is partially formed with grooves 17 so that it is divided into a plurality of island regions by $P^+$-type isolation layers 6 which connect the bottoms of the grooves 17 and the $P^-$-type substrate 3.

Each of the island regions is formed with NPN transistors $Q_{260}$ and $Q_{270}$ by the use of photolithography. The resultant structure is a remarkably fine IC, in which the $N^-$-type epitaxial layer has a thickness of 1.7 microns and in which the transistors have bases 7 (8) of depth of 0.7 microns and emitters 9 (10) of depth of 0.4 microns, for example. By the grooves 17 formed partially in the epitaxial layer 5, moreover, it is possible to minimize the transverse extension of the isolation layers 6 and to remarkably reduce the collector series resistances of the transistors. As is now apparent from the description thus far made, the current amplifying circuit is so made by the ultrafine process technique that it can have high-speed operations and remarkably excellent RF characteristics.

Here, let a stray capacity $C_f$ be considered, which is parasitic between the bases and collectors of the output transistors of the aforementioned current mirror circuits. As can be understood from FIG. 7, the base-collector stray capacity $C_f$ and a collector-substrate parasitic capacity $C_p$ are increased in accordance with the increase in the number of the output transistors $Q_{270}$ of each of the current mirror circuits. In the present invention, therefore, the number of the output transistors of each current mirror circuit is suppressed below a predetermined value (in the present case, 32) to prevent any augmentation of the parasitic capacity.

If each current mirror circuit is equipped with an excessive number of output transistors for on reference transistor, on the other hand, the result is deterioration of the accuracy of the current mirror ratio due to the base current of each transistor. In order to prevent the deterioration thereby to generate an accurate output current according to the input $V_{IN}$, it is effective to suppress the number of the output transistors below a predetermined value. In the present embodiment, to obtain operation with the desired 200 MHz band it was found to be sufficient to use m=32 output transistors $Q_{270}$ for each current mirror circuit. Of course, the invention is not limited to this since the number used, and the particular arrangement used to arrive at the multiplication factors m and n, will depend on the frequency charcteristics desired.

With regard to selecting values for m and n, the following points are noted.

In order to obtain high frequency signal components of 200 MHz from the output line $l_2$, applicants have found that the number of $n \times m$ should generally be less than 500, and more preferably less than 300.

In the current mirror circuit 1001 a buffer transistor $Q_{250}$ is connected between the bases of the transistors $Q_{260}$ and $Q_{270}$ and the collector of the transistor $Q_{260}$ so that the emitter current of the buffer transistor $Q_{250}$ is $(1+m)I_{IN}/(1+h_{FE})$ and the base current of the buffer transistor $Q_{250}$ is $(1+m)I_{IN}/(1+h_{FE})^2$, where $h_{FE}$ is current gain of NPN transistors $Q_{250}$, $Q_{260}$ and $Q_{270}$.

This base current of the buffer transistors $Q_{250}$ causes an error of current mirror ratio of the current mirror circuit 1001. In order to make this error small, m should be less than $h_{FE}$. Namely, $h_{FE}$ is usually in the range of 100-200 so that the value of m should be less than 100. If m and $h_{FE}$ are 100, the error of the current mirror ratio is $(1+100)/(1+100))^2 = 101/10201 = 0.99\%$. Also, the number m should be less $h_{FE}$ to keep the current mirror ratio error small.

(d) Device for Reducing the Temperature Dependency of the Bias Current of the Current Mirror Circuit An important device for reducing the temperature dependency of the input current $I_{IN}$ is made in the current mirror circuit shown in FIG. 2. Specifically, the input $I_{IN}$ of the current mirror circuit is expressed by $I_{IN}=I_X-I_S$, i.e., the difference between the two currents $I_X$ and $I_S$. As a matter of fact, these currents $I_X$ and $I_S$ are adapted to vary similarly (namely to have identical temperature characteristics) when the ambient temperature of the IC varies, so that the input $I_{IN}(=I_X-I_S)$ is held substantially at a constant level even for a varying ambient temperature.

This can be understood from the following equations:

$$I_S = \frac{V_{IN} - (V_{BE\ Q200} + V_{BE\ Q220} + V_{BE\ Q210})}{R_{60} + R_{110}} \quad (1)$$

$$= \frac{V_{IN} - 3V_{BE}}{R_{60} + R_{110}};$$

and $$I_X = \frac{V_X - (V_{BE\ Q_a} + V_{BE\ Q250} + V_{BE\ Q260}) - I_{IN}R_{140}}{R_{61}} \quad (2)$$

$$= \frac{V_X - 3V_{BE} - I_{IN}R_{140}}{R_{61}}.$$

From the above Equations (1) and (2), the following equation can be obtained:

$$I_{IN} = I_X - I_S = \frac{V_X - 3V_{BE} - I_{IN}R_{140}}{R_{61}} - \quad (3)$$

$$\frac{V_{IN} - 3V_{BE}}{R_{60} + R_{110}}$$

$$= \frac{V_X - I_{IN}R_{140}}{R_{61}} - \frac{V_{IN}}{R_{60} + R_{110}} -$$

$$\frac{3V_{BE}}{R_{61}} + \frac{3V_{BE}}{R_{60} + R_{110}}$$

If $R_{61} = R_{60} + R_{110}$ is selected from the third term and the fourth term, the term including $V_{BE}$ disappears so that the temperature dependency of the current $I_{IN}$ is eliminated. In other words, the base-emitter voltage $V_{BE}$ of the transistors has a temperature characteristic of about $-2mV/°$ C., which can be completely cancelled so that the input current $I_{IN}$ of the current mirror circuit will have stability in not being dependent on the ambient temperature.

Embodiment 2

Figure 3:
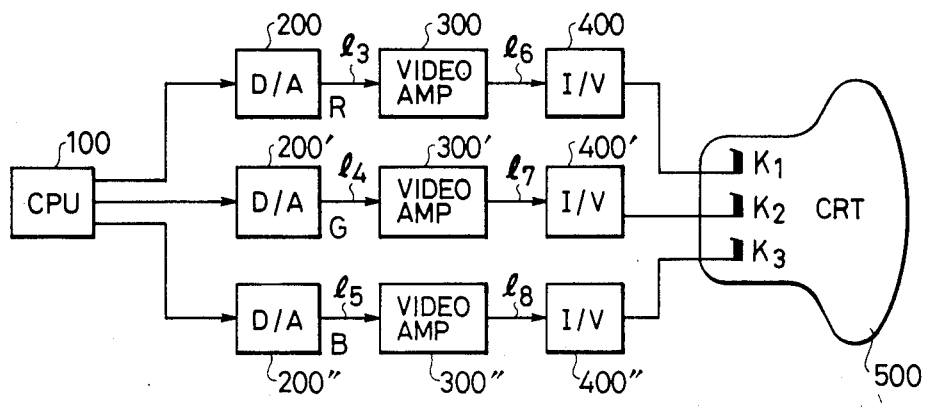
FIG. 3 is a system diagram showing a very fine display according to a second embodiment of the present invention.

FIG. 3 shows the construction of the highly fine display according to a second embodiment of the present invention. A video amplifier 300 (or 300' or 300") corresponds to the current amplifying circuit 1 of voltage-current converting type of FIG. 1, and I/V (e.g., current-voltage) converting means 400 (or 400' or 400") corresponds to the resistor $R_{200}$ of FIG. 1. The specific construction of the video amplifier 300 (or 300' or 300") and the I/V converting means 400 (or 400' or 400") will be described in detail with reference to FIGS. 4 and 5.

(a) Overall Construction

The highly fine display is constructed, as shown in FIG. 3, of: a central processing unit (i.e., CPU) 100: the D/A converter 200 (or 200' or 200") for converting the individual digital primary color signals of red (R), green (G) and blue (B) sent out from the CPU 100; the video amplifier 300 (or 300' or 300") the I/V converter 400 (or 400' or 400"); and a CRT 500.

An image displayed on the CRT has its brightness controlled by the applied voltages of cathodes $K_1$, $K_2$ and $K_3$, and its color determined by the mixing ratio of the colors R, G and B.

The output lines $l_3$, $l_4$ and $l_5$ of the D/A converters each generate an RF signal having a band of 200 MHz, for example, which is respectivley input to the video amplifiers 300, 300' and 300". These video amplifiers 300, 300' and 300" are individually integrated by the ultrafine process technique into the voltage-current type current amplifying circuits. The output currents attained from those video amplifiers are subjected to I/V conversion to generate a voltage output, which is impressed upon the cathodes $K_1$, $K_2$ and $K_3$.

As a result, electrons are emitted from the cathodes so that the fluorescent elements (although not shown) of the individual colors are lit to produce a desired color image.

The scanning lines (or rasters) of this CRT are 1000 or more in number so that a remarkably fine image can be produced.

(b) Features (i) Each of the video amplifiers is integrated by the ultrafine process technique so that it can have excellent RF characteristics. As a result, the electron beams can be scanned at ultrahigh speeds.

(ii) The high current outputs are generated by the video amplifiers and are then converted into voltages so that a high voltage output can be attained to remarkably widen the output dynamic range. As a result, the voltages to be applied to the cathodes can be finely controlled to express delicate differences in colors.

(iii) The video amplifiers are individually integrated so that the crosstalk among the signals of the colors R, G and B can be completely prevented.

Figure 4:
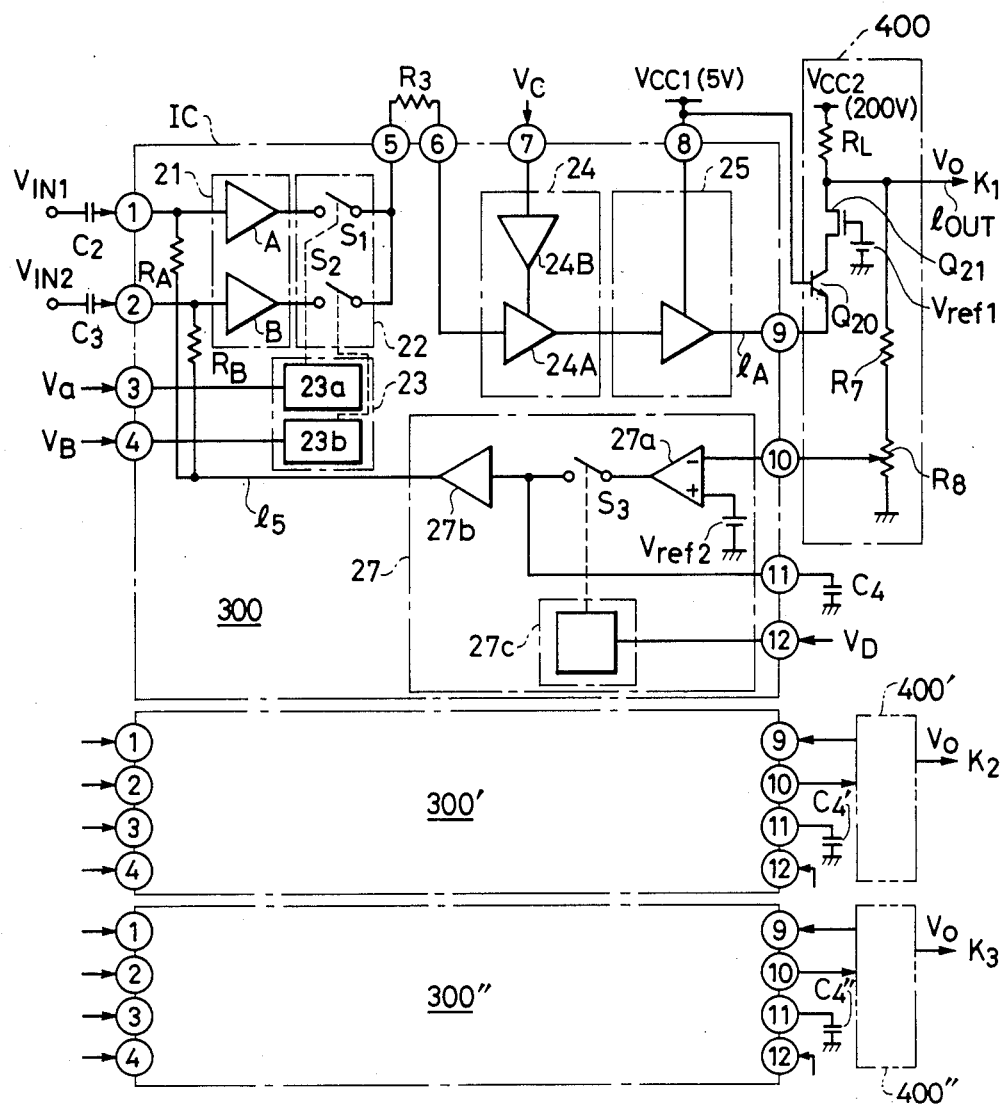
FIG. 4 is a block diagram showing a video amplifier 300 (300' or 300") shown in FIG. 3.
Figure 5:
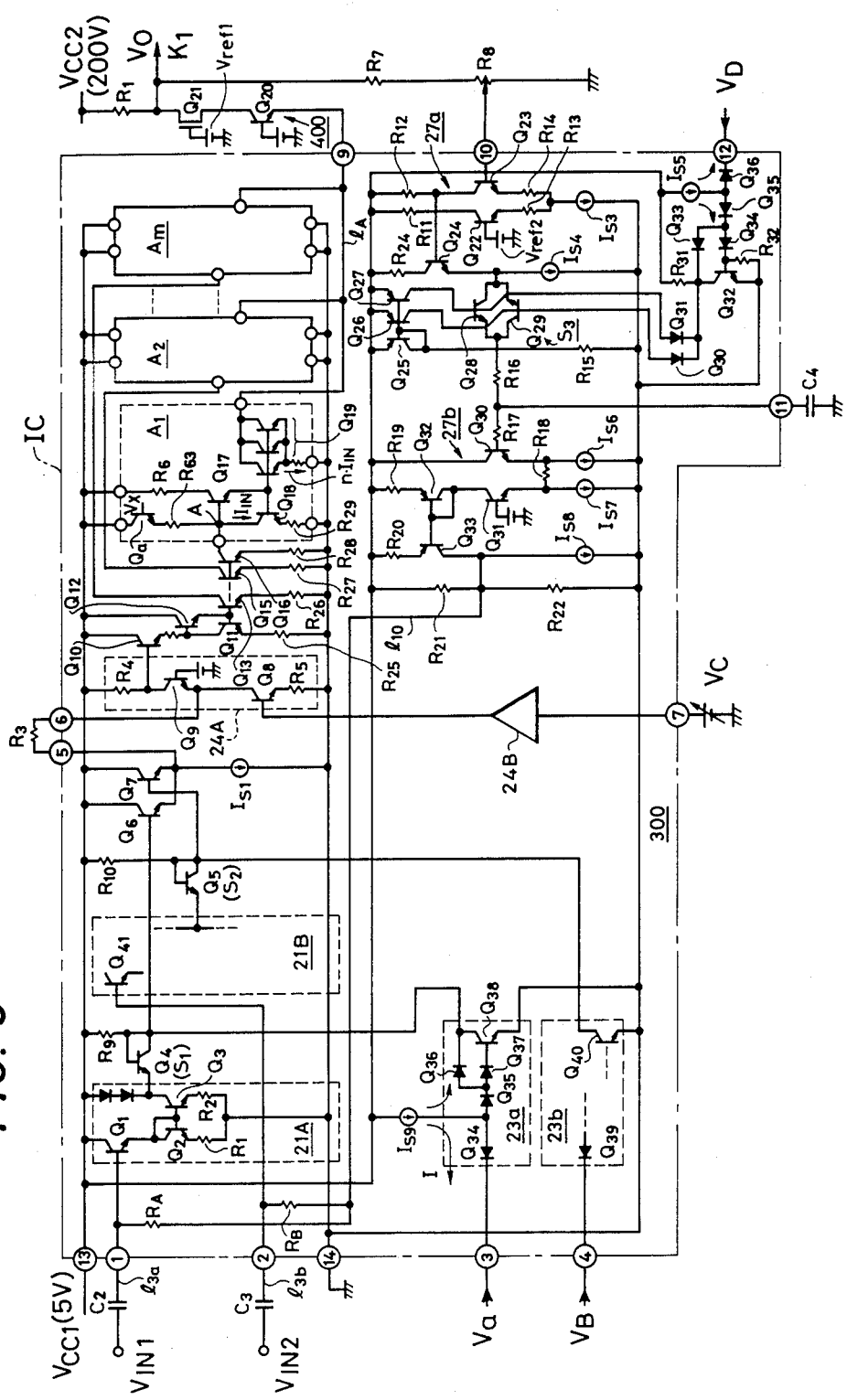
FIG. 5 is a more specific circuit diagram showing the video amplifier 300 shown in FIG. 4.

(c) Specific Overall Constructions of Video Amplifiers and I/V Converting Means FIG. 4 is a block diagram showing the video amplifier 300 and the I/V converter 400, and FIG. 5 is a circuit diagram showing a more specific circuit construction of these elements.

A first description will be made with reference to FIG. 4. This IC is equipped with two input terminals (e.g. ① and ② pins) so that it can produce a composed video signal of the two inputs $V_{IN1}$ and $V_{IN2}$. Reference numerals 21A and 21B indicate buffers which are made receptive of signals $V_{IN1}$ and $V_{IN2}$ at a TTL level. Switches $S_1$ and $S_2$ are controlled by control circuits 23a and 23b. The outputs of the buffers 21A and 21B are input through a preamplifier 24 (which has its gain made variable by a control $V_C$) to a voltage-current conversion type current amplifying circuit 25. The output of this current amplifying circuit 25 is converted into a voltage by an I/V converting resistor $R_L$ of the I/V converting means 400, which is provided outside of the IC. Transistors $Q_{20}$ and $Q_{21}$ are provided for preventing oscillation. In order to stabilize the DC bias of an output line $l_{OUT}$, moreover, there is provided a negative feedback path which is composed of resistors $R_7$ and $R_8$, an operation amplifier 27a, buffers 27b, and a resistor $R_A$ ($R_B$).

A switch $S_3$ provided in the negative feedback line is controlled by a control circuit 27c, which in turn is controlled by a pedestal level clamp pulse $V_D$.

Figure 8:
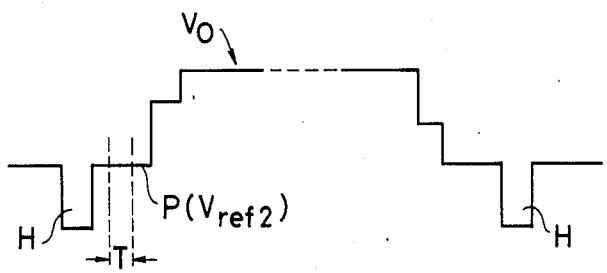
FIG. 8 is a waveform chart showing an output color signal.

The timing at which that pedestal level clamp pulse is applied will be described with reference to FIG. 8. This figure shows an output color signal $V_O$ appearing in the output line $l_{OUT}$ whereas a letter "H" designates a horizontal synchronizing signal. The aforementioned pedestal level clamp pulse $V_D$ is impressed during a shown term T, whereupon the potential of a pedestal level P is fixed at a reference potential $V_{ref2}$ by providing a negative feedback.

(d) Specific Circuit Constructions of Video Amplifier and I/V Converting Means FIG. 5 shows a more specific circuit construction of the IC shown in FIG. 4. Identical parts and portions shared between FIGS. 5 and 4 are indicated by identical reference characters.

The buffer circuit 21A (or 21B) is composed of an NPN transistors $Q_1$ (or $Q_{41}$) made receptive of the input signal, and a current mirror circuit. The switch $S_1$ (or $S_2$) is composed of a diode $Q_4$ (or $Q_5$) using a transistor. The relationship between the switch $S_1$ and a control signal $V_a$ will be described in the following. If the control signal $V_a$ is at the "H" level, a constant current I sent out from a constant current source $I_{S9}$ drives the base of a transistor $Q_{38}$ through diodes $Q_{35}$ and $Q_{37}$ so that the transistor $Q_{38}$ is turned on. Then, the collector of that transistor $Q_{38}$ is grounded so that a diode $Q_4$ is inversely biased to block the signal transmission.

If the control signal $V_a$ is dropped to an "L" level, the current sent out from the constant current source $I_{S9}$ is shunted through a diode $Q_{34}$ to the $V_a$ input terminal so that the transistor $Q_{38}$ is turned off. Then, the anode potential of the diode $Q_4$ is raised to bias the diode $Q_4$ forward so that the diode acts a level shifting means to effect the signal transmission.

The preamplifier 24A is constructed of a constant current source composed of a base-grounded transistor $Q_9$, a transistor $Q_8$ and a resistor $R_5$, and a load resistor $R_4$. By the control signal $V_c$ impressed by a seventh pin, the base potential of the transistor $Q_8$ is controlled so that the bias current can be varied to finely control the gain of the preamplifier.

Figure 9:
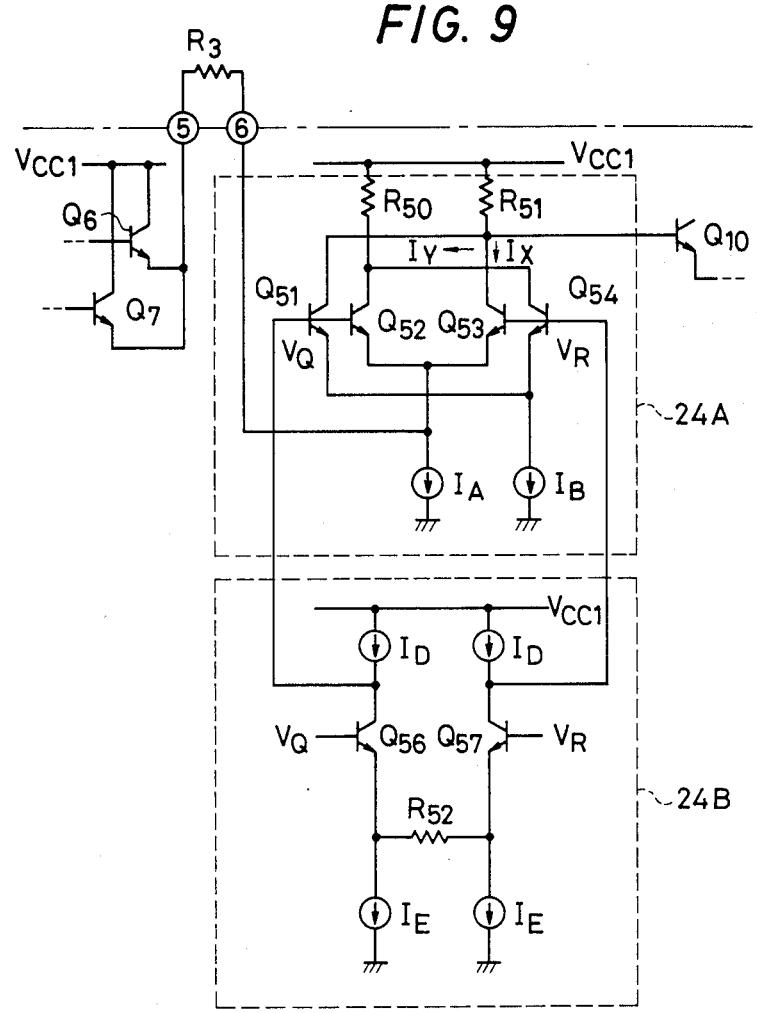
FIG. 9 is a circuit diagram showing another example of a preamplifier 24A and a gain adjusting circuit 24B of the former.

Moreover, other circuit constructions of a preamplifier 24A and a circuit 24B for finely controlling the gain of the preamplifier 24A are shown in FIG. 9. By varying control voltages $V_Q$ and $V_R$ to be applied to transistors $Q_{56}$ and $Q_{57}$ making a differential pair of the precise gain controlling circuit 24B, the composite current of the currents $I_X$ and $I_Y$ of the preamplifier 24A is varied. As a result, a voltage drop to be caused in a resistor $R_{51}$ can be varied to effect the gain adjustment. Constant currents $I_A$ and $I_B$ have different current flows. Since the circuit construction downstream of an emitter follower $Q_{10}$ made receptive of the output of that preamplifier up to a ninth pin or the output pin of the IC is similar to that shown in FIG. 2, its description is omitted together with the description of the circuit operation.

Returning to FIG. 5, the voltage-current (I/V) converting means 400 is composed of a load resistor $R_{21}$ and the transistors $Q_{20}$ and $Q_{21}$ provided for preventing oscillation.

The negative feedback input is applied from a tenth pin to the base of one $Q_{23}$ of transistors $Q_{22}$ and $Q_{23}$ making a differential pair. The switch $S_3$ is composed of transistors $Q_{28}$ and $Q_{29}$. When the pedestal level clamp pulse $V_D$ is input, the current sent out from a constant current $I_{S5}$ flows toward a 12th pin to drive the base of a transistor $Q_{23}$ through the diodes $Q_{34}$ and $Q_{35}$ to turn on the transistor $Q_{32}$. Then, a base current is fed to the transistors $Q_{28}$ and $Q_{29}$ composing the switch $S_3$ to effect the signal transmission.

The negative feedback signal is fed back through the buffer amplifier 27b and a negative feedback line $l_{10}$ to input signal lines $l_{3a}$ and $l_{3b}$.

From FIG. 5, it can be seen that the construction of the current amplifier 25 is similar to that of the amplifier 1 of FIG. 1 in that it is constructed of m current mirror circuits $A_1$-$A_m$. Each of these current mirrors will increase the input current by a factor of n, so that the composite output current at the terminal 9 will be $I_{OUT}=m \times n \times I_{IN}$ (where $I_{IN}$ is the current applied, for example, to the terminal A shown for the current mirror circuit $A_j$). As such, the current mirrors $A_j$-$A_m$ operate similarly to the current mirrors 100$_1$ - 100$_m$ discussed earlier for FIG. 2 to provide a large increase in the current without the need for any of the elements of the amplifier requiring a high breakdown voltage.

Embodiment 3

Figure 6:
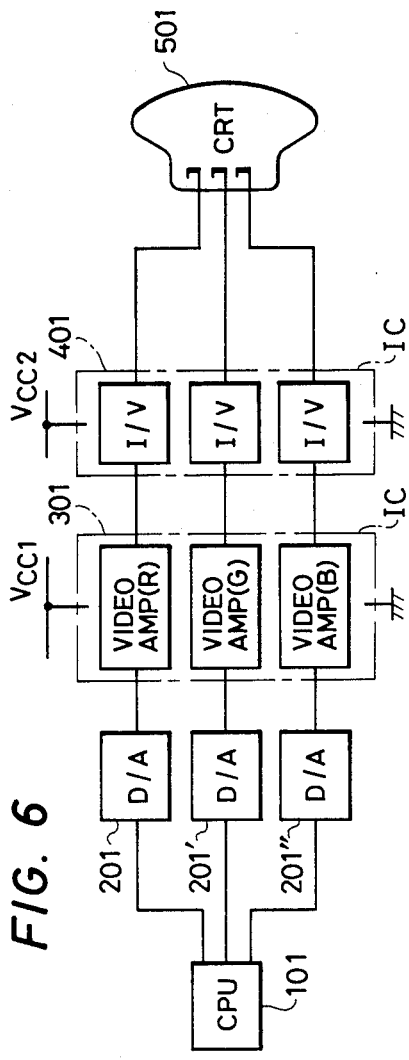
FIG. 6 is a system diagram showing a very fine display according to a third embodiment of the present invention.

FIG. 6 shows still another embodiment of the present invention. The circuit construction of this highly fine display is substantially similar to that of the embodiment 2 but is different therefrom in that the video amplifiers for individual color signals R, G and B are integrated together and in that the I/V converting means is also integrated.

Since the individual video amplifiers are integrated, their temperature characteristics (i.e., the variations in the amplification factor for different ambient temperatures) becomes coincident.

Since the I/V converting means is also integrated, moreover, the display can be made compact.

An IC 401 is fabricated by making use of a high breakdown voltage element processing technique.

It is to be understood that the above-described arrangements are simply illustrative of the application of the principles of this invention. Numerous other arrangements may be readily devised by those skilled in the art which embody the principles of the invention and fall within its spirit and scope.

We claim:

1. An amplifier comprising:
   (1) current amplifying means for generating an amplified output current in accordance with an input signal; and
   (2) current-voltage converting means for converting said output current into an output voltage,
   wherein a supply voltage $V_{cc1}$ of said current amplifying means and a supply voltage $V_{cc2}$ of said current-voltage converting means are set separately from each other to have a relationship of $V_{cc1} < V_{cc2}$.

2. An amplifier according to claim 1, wherein said input signal is input through a coupling capacitor to said current amplifying means, wherein said current amplifying means and said current-voltage converting means are directly connected in a DC biasing manner, and wherein negative feedback means is coupled between an output terminal of said current-voltage converting means and an input terminal of said current amplifying means in order to maintain the bias of the output terminal of said current-voltage converting means at a predetermined potential.

3. An amplifier according to claim 1, wherein said current amplifying means includes:
   voltage-current converting means responsive to said input signal and for generating an input current signal in accordance with said input signal;
   a plurality of current amplifying circuits which are coupled to said voltage-current converting means, each of which forms an amplified current signal in accordance with said input current signal; and
   current composing means for composing the respective amplified current signals formed by said plural current amplifying circuit into a composite current to be applied to said current-voltage converting means.

4. An amplifier according to claim 3, wherein said current-voltage converting means includes impedance means for converting the composite current generated by said current composite means into said output voltage.

5. An amplifier according to claim 4, wherein said amplifying means further comprises means coupled between said voltage-current converting means and said amplifying circuits and for forming a plurality of current signals to be applied to said amplifying circuits, wherein one of said current signals is applied to one of said amplifying circuits.

6. An amplifier according to claim 5, wherein each of said current amplifying circuit includes means to multiply said current signal by n (wherein n is a positive integer).

7. An amplifier according to claim 6, wherein each of said current amplifying circuits includes a current mirror circuit having a reference transistor, and a plurality of output transistors coupled to said reference transistor so that their current flows are controlled by said reference transistor.

8. An amplifier according to claim 7, further comprising current signal generating means for generating a current signal $I_X$ so that the generated current signal $I_X$ has a substantially identical temperature characteristic to that of said current signal, wherein a current signal $I_{IN}$ to be applied to said reference transistor in said current mirror circuit is determined by the difference between a generated current signal $I_X$ and said current signal.

9. An amplifier according to claim 4, wherein said current amplifying means is formed on an IC, and wherein said current-voltage converting means is provided outside of said IC.

10. An amplifier according to claim 9, wherein each of said current amplifying circuits includes
means to multiply said current signal by n (wherein n is a positive integer).

11. An amplifier according to claim 10, wherein each of said current amplifying circuits includes a current mirror circuit having a reference transistor, and a plurality of output transistors coupled to said reference transistor so that their current flows are controlled by said reference transistor.

12. An amplifier according to claim 11, further comprising current signal generating means for generating a current signal $I_X$ so that the generated current signal $I_X$ has a substantially identical temperature characteristic to that of said current signal, wherein a current $I_{IN}$ to be applied to said reference transistor in said current mirror circuit is determined by the difference between a generated current signal $I_X$ and said current signal.

13. An amplifier according to claim 11, wherein said reference transistor and said output transistors in said current amplifier circuits are bipolar NPN transistors.

14. An amplifier according to claim 6, wherein said current amplifying means is formed on an IC, and wherein said current-voltage converting means is provided outside of and separately of said IC.

15. An amplifier according to claim 14, wherein said reference transistor and said output transistors in said current amplifying circuit are bipolar NPN transistors.

16. A display comprising:
a plurality of amplifiers for amplifying predetermined respective input primary color signals; and
display means having a function to display in a picture tube, images corresponding to respective output signals of said amplifiers,
wherein each of said amplifiers comprises:
current amplifying means for generating an amplified output current according to one of said input color signals; and
current-voltage converting means for converting said output current into an output voltage to be applied to said display means,
wherein a supply voltage $V_{cc1}$ of said current amplifying means and a supply voltage $V_{cc2}$ of said current-voltage converting means are set separately from each other to have a relationship of $V_{cc1} < V_{cc2}$.

17. A display according to claim 16, wherein said current amplifying means is formed on an IC, and wherein said current-voltage converting means is provided outside of and separately of said IC.

18. A display according to claim 16, wherein said input signal is input through a coupling capacitor to said current amplifying means, wherein said current amplifying means and said current-voltage converting means are directly connected in a DC biasing manner, and wherein a negative feedback means is coupled between an output terminal of said current-voltage converting means and an input terminal of said current amplifying means in order to maintain the bias of the output terminal of said current-voltage converting means at a predetermined potential.

19. A display according to claim 18, wherein said negative feedback means is controlled by pulses of a pedestal level clamp of said color signals.

20. A display according to claim 16, wherein said plural amplifiers are formed on ICs independently of one another.

21. A display according to claim 16, wherein said plural amplifiers are formed in one semiconductor substrate.

22. A display according to claim 16, wherein the current-voltage converting means of each of said amplifiers is formed in one semiconductor substrate.

23. A display according to claim 16, further comprising an analog switch circuit for selectively transmitting a predetermined one of said plurality of input color signals, wherein said analog switch circuit includes a diode composed of a transistor for controlling its signal transmission by controlling its anode potential with a control transistor.

24. A display according to claim 16, wherein said current amplifying means includes:
voltage-current converting means responsive to said input color signal and for generating an input current signal in accordance with said input color signal;
a plurality of current amplifying circuits which are coupled to said voltage-current converting means, each of which forms an amplified current signal in accordance with said input current signal; and
current composing means for composing the respective amplified current signals formed by said plural current amplifying circuit into a composite current to be applied to said current-voltage converting means.

25. A display according to claim 24, wherein said current-voltage converting means includes impedance means for converting the composite current generated by said current composite means into said output voltage, and wherein said display means includes electron emitting means for emitting from its cathode, electrons having their energies controlled by the output voltage which is generated from said impedance means, and a fluorescent member for emitting a light upon reception of the energies of the electrons emitted.

26. A display according to claim 25, wherein said amplifying means further comprises means coupled between said voltage-current converting means and said amplifying circuits and for forming a plurality of current signals to be applied to said amplifying circuits, wherein one of said current signals is applied to one of said amplifying circuits.

27. A display according to claim 26, wherein said current amplifying means is formed on an IC, and wherein said current-voltage converting means is provided outside of said IC.

* * * * *